(12) United States Patent
Tu

(10) Patent No.: US 11,145,804 B2
(45) Date of Patent: Oct. 12, 2021

(54) INPUT DEVICE AND MANUFACTURING METHOD THEREOF

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventor: Yu-Chieh Tu, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Mialoli County (TW)

( * ) Notice: Subject to any disclaimer, the term of this patent is extended or adjusted under 35 U.S.C. 154(b) by 584 days.

(21) Appl. No.: 16/101,516

(22) Filed: Aug. 12, 2018

(65) Prior Publication Data

US 2019/0393402 A1 Dec. 26, 2019

(30) Foreign Application Priority Data

Jun. 26, 2018 (CN) .......................... 201810668346.7

(51) Int. Cl.
*H01L 41/047* (2006.01)
*H01L 41/35* (2013.01)

(52) U.S. Cl.
CPC .......... *H01L 41/0477* (2013.01); *H01L 41/35* (2013.01)

(58) Field of Classification Search
CPC ........................... H01L 41/35; H01L 41/0477
See application file for complete search history.

(56) References Cited

U.S. PATENT DOCUMENTS

2004/0136117 A1* 7/2004 Kuwajima .......... H01L 41/0986
360/294.4

\* cited by examiner

*Primary Examiner* — Shawki S Ismail
*Assistant Examiner* — Monica Mata
(74) *Attorney, Agent, or Firm* — CKC & Partners Co., LLC

(57) ABSTRACT

An input device includes a substrate structure, a conductive adhesive layer, and a piezoelectric structure. The conductive adhesive layer is disposed over the substrate structure. The conductive adhesive layer includes an adhesive portion and a plurality of metal particles, and the plurality of metal particles are substantially aligned in a first direction. The piezoelectric structure is disposed over the conductive adhesive layer. The piezoelectric structure extends in a second direction that is perpendicular to the first direction.

18 Claims, 5 Drawing Sheets

INPUT DEVICE AND MANUFACTURING METHOD THEREOF

CROSS-REFERENCE TO RELATED APPLICATION

This application claims priority to Chinese Application Serial Number 201810668346.7, filed Jun. 26, 2018, which is herein incorporated by reference in its entirety.

BACKGROUND

Field of Invention

The present disclosure relates to an input device, and a method for manufacturing an input device.

Description of Related Art

Input devices such as piezoelectric buttons usually include two electrodes and a piezoelectric material layer between the two electrodes. Because of the material properties of the piezoelectric material layer, when a finger presses the button position to cause deformation of the piezoelectric material layer, electrical signals will be generated and output.

In the current manufacturing process, when an anisotropic conductive film (ACF) or anisotropic conductive adhesive (ACA) is used to bond a piezoelectric material layer and a substrate, pressure must be provided to connect the conductive particles with each other in the ACF or ACM and to achieve electrical conduction. However, because the piezoelectric material layer is very fragile, when pressure is provided, there is a risk of rupture of the piezoelectric material layer.

SUMMARY

The present disclosure provides an input device including a substrate structure, a conductive adhesive layer, and a piezoelectric structure. The conductive adhesive layer is disposed over the substrate structure. The conductive adhesive layer includes an adhesive portion and a plurality of metal particles, and the plurality of metal particles are substantially aligned in a first direction. The piezoelectric structure is disposed over the conductive adhesive layer. The piezoelectric structure extends in a second direction that is perpendicular to the first direction.

In some embodiments of the present disclosure, the substrate structure includes a substrate and a first electrode layer disposed over the substrate. The piezoelectric structure includes a piezoelectric material layer and a second electrode layer disposed under the piezoelectric material layer, and the first electrode layer overlaps with the second electrode layer in the first direction.

In some embodiments of the present disclosure, the substrate structure further includes a third electrode layer disposed over the substrate. The third electrode and the first electrode are insulated from each other. The piezoelectric structure further includes a fourth electrode layer having a first portion. The first portion is disposed under the piezoelectric material layer. The fourth electrode layer and the second electrode are insulated from each other, and the third electrode overlaps with the first portion of the fourth electrode layer in the first direction.

In some embodiments of the present disclosure, the first electrode layer and the third electrode extend on the same plane, and the second electrode layer and the fourth electrode layer extend on the same plane.

In some embodiments of the present disclosure, the fourth electrode layer further has a second portion disposed over the side wall of the piezoelectric material layer, and a third portion disposed over the piezoelectric material layer. The first portion contacts the second portion, and the second portion contacts the third portion.

In some embodiments of the present disclosure, the piezoelectric material layer includes lead zirconate titanate.

In some embodiments of the present disclosure, the thickness of the piezoelectric material layer is less than 400 μm (micrometer).

In some embodiments of the present disclosure, the plurality of metal particles include a metal having at least one half-full d orbital in the ground state.

The present disclosure also provides a method for manufacturing an input device, and the method includes the following steps: (i) providing a substrate structure; (ii) dispensing an adhesive and a plurality of metal particles over the substrate structure, wherein the plurality of metal particles are dispersed in the adhesive; (iii) disposing a piezoelectric structure over the adhesive and the plurality of metal particles, wherein the piezoelectric structure extends along a first direction; (iv) aligning the plurality of metal particles substantially in a second direction that is perpendicular to the first direction; and (v) curing the adhesive.

In some embodiments of the present disclosure, step (iv) is performed by providing a magnetic field.

The above description will be described in detail in the following embodiments, and further explanation of the technical scheme of the present disclosure will be provided.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
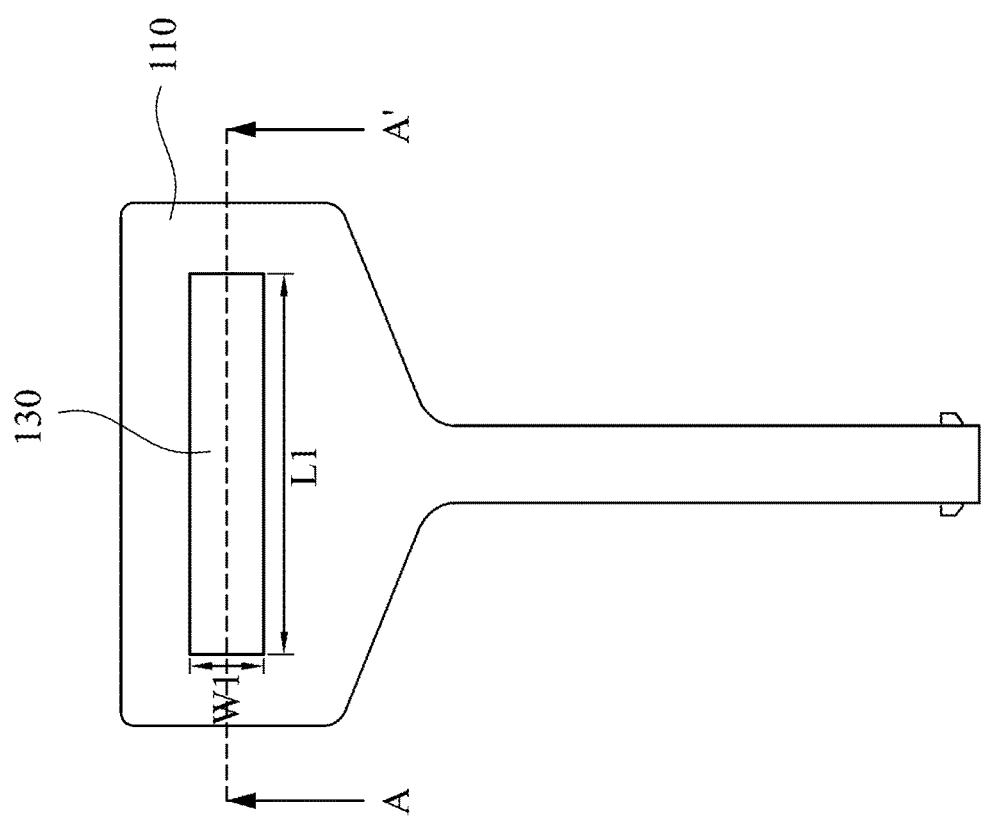
FIG. 1 is a schematic top view of the input device according to one embodiment of the present disclosure.

In order to make the description of the present disclosure more detailed and complete, a descriptive description of the specific embodiments and examples is provided; but this is not the only way to implement or apply the specific examples of the present disclosure. The various examples disclosed below can be combined or replaced with each other in a beneficial situation, and other examples can also be added into an example without further description or explanation. In the following description, numerous specific details are provided in order to provide a thorough understanding of the following examples. However, examples of the present disclosure may be carried out without such specific details.

Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure are described in detail below, but the present disclosure is not limited by the scope of the examples.

Figure 2:
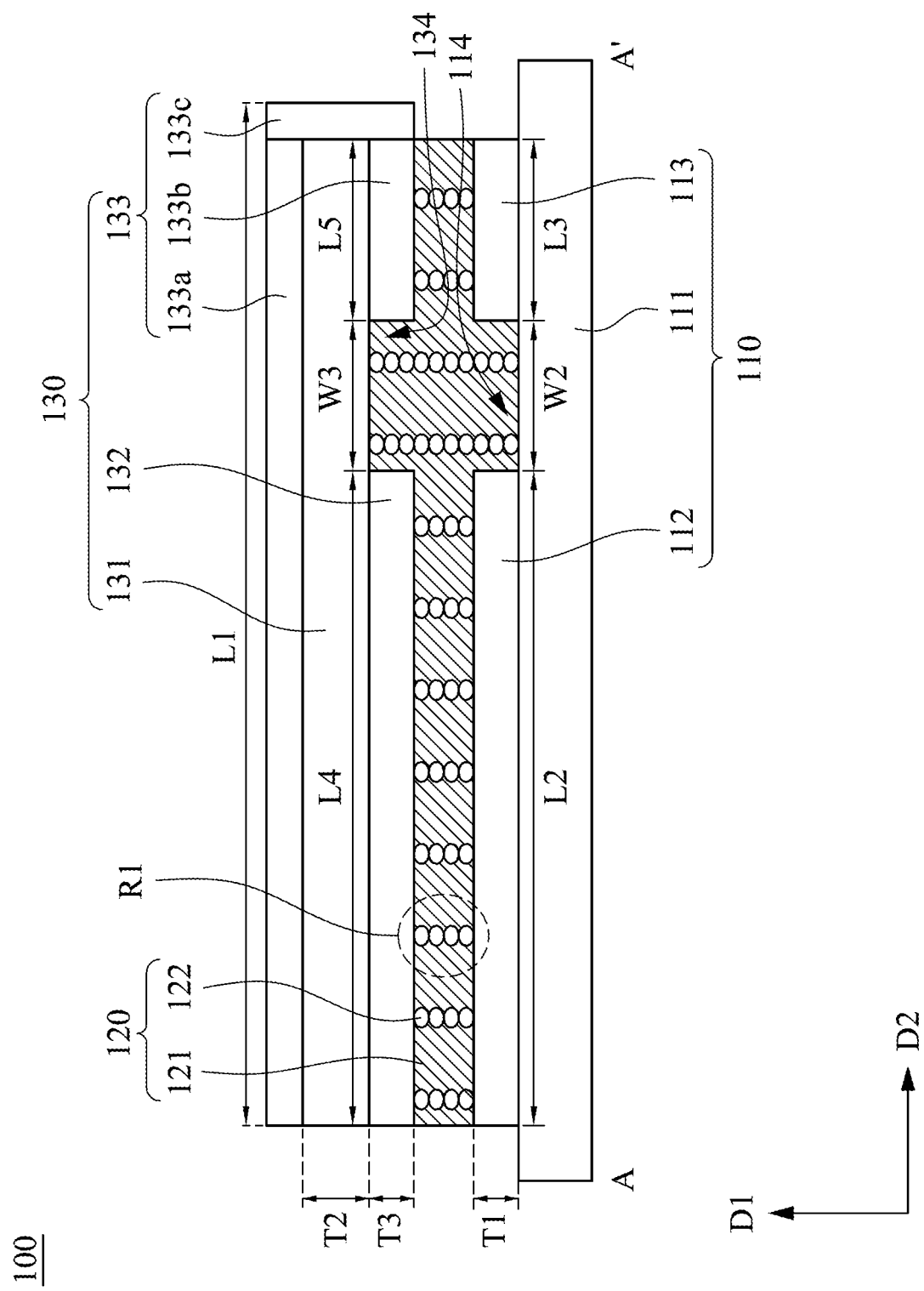
FIG. 2 is a schematic cross-sectional view of the input device along the tangent line A-A' of FIG. 1 according to one embodiment of the present disclosure.

Please refer to FIG. 1 and FIG. 2. FIG. 1 illustrates a schematic top view of an input device 100 according to one embodiment of the present disclosure. FIG. 2 illustrates a schematic cross-sectional view of the input device 100 along the dot line A-A' of FIG. 1. As shown in FIG. 1 and FIG. 2, the input device 100 includes a substrate structure 110, a piezoelectric structure 130, and a conductive adhesive layer 120 disposed between the substrate structure 110 and the piezoelectric structure 130.

The substrate structure 110 includes a substrate 111, a first electrode layer 112 and a third electrode layer 113 both disposed on the substrate 111. In some examples, the substrate 111 may be a flexible substrate, such as polyamide (PI) substrate. In some examples, the substrate 111 may be a rigid substrate, such as a glass substrate or a plastic substrate.

In some examples, the first electrode layer 112 and the third electrode layer 113 include metal, such as copper or silver. The first electrode layer 112 and the third electrode layer 113 extends on the same plane, and the first electrode layer 112 and the third electrode layer 113 have the same thickness T1.

In some examples, the thickness T1 may be 1 to 10 μm, such as 2, 3, 4, 5, 6, 7, 8, or 9 μm. The first electrode layer 112 and the third electrode layer 113 are separated by a gap 114, such that the first electrode layer 112 and the third electrode layer are insulated from each other. In some examples, the width W2 of the gap 114 may be 0.1 to 1 mm (millimeter), such as 0.2, 0.3, 0.5, 0.7, or 0.9 mm. In some examples, the length L2 of the first electrode layer 112 may be 15 to 35 mm, such as 20, 22, 26, 30, or 32 mm. In some examples, the length L3 of the third electrode layer 113 may be 0.1 to 2.4 mm, such as 0.2, 0.6, 1.2, 1.8, or 2.2 mm.

The conductive adhesive layer 120 is disposed over the substrate structure 110. The conductive adhesive layer 120 includes an adhesive portion 121 and a plurality of metal particles 122. In some examples, the adhesive portion 121 includes acrylic resin or epoxy resin. In some examples, the particle sizes of the metal particles 122 range from 0.1 to 50 μm, such as 0.5 μm, 1 μm, 3 μm, 8 μm, 15 μm, 20 μm, 25 μm, or 35 μm.

In some examples, the metal particles 122 include a metal having at least one half-full d orbital in the ground state, such as iron (Fe), or nickel (Ni). Using a metal having at least one half-full d orbital in the ground state as the material for the metal particles 122 provides specific technical effects, as described in more detail below. The metal particles 122 are substantially aligned along the first direction D1.

Figure 3:
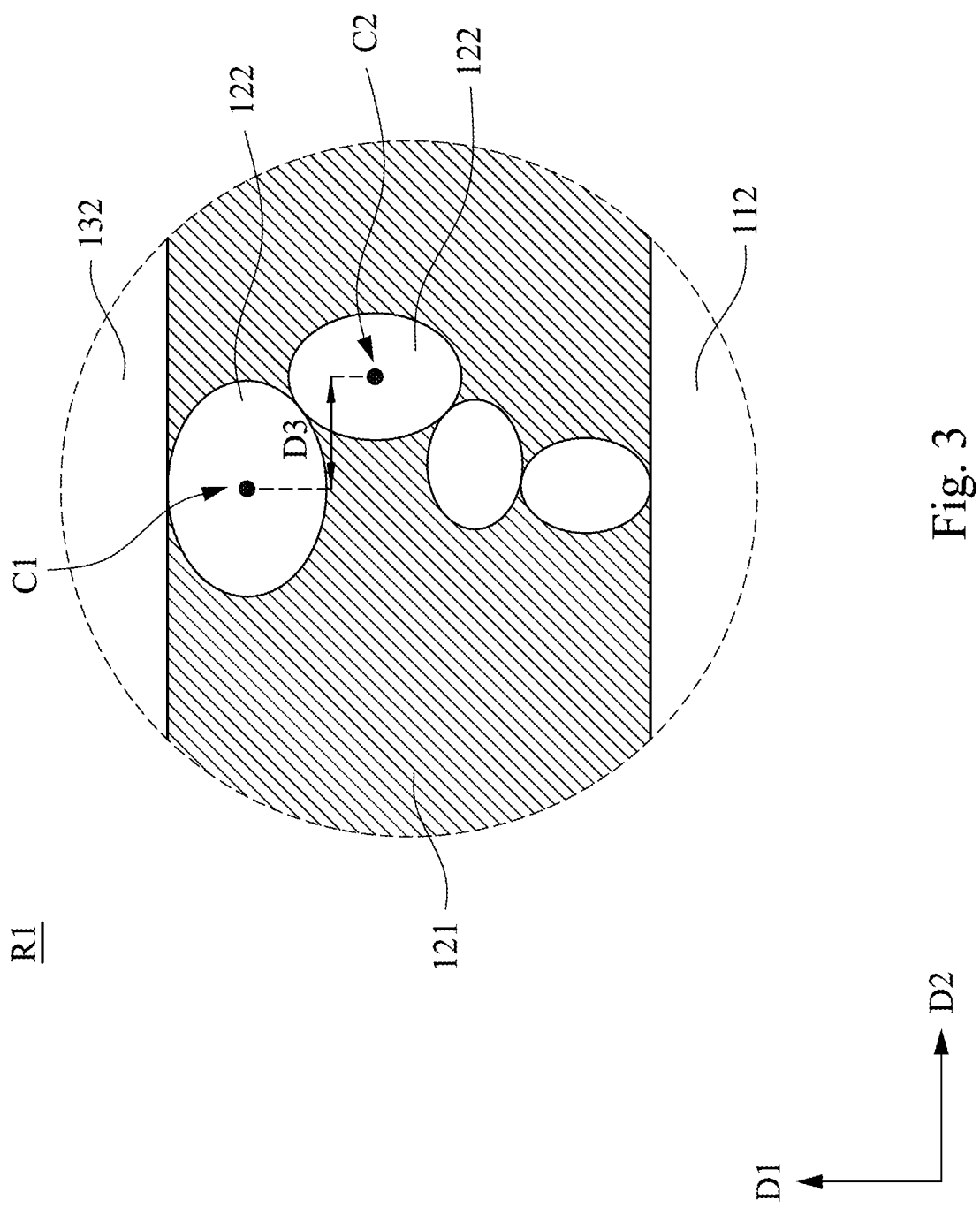
FIG. 3 is an enlarged view of a portion of the input device according to one embodiment of the present disclosure.

Please refer to FIG. 3, which illustrates the enlarged view of the region R1. In some examples, the distance D3 between the center C1 and the C2 of the two metal particles 122 in the second direction D2 perpendicular to the first direction D1 is not more than 30 μm, such as 25 μm, 20 μm, 15 μm, 10 μm, 5 μm, 3 μm, 2 μm, or 1 μm.

Please still refer to FIG. 1 and FIG. 2, in some examples, the length L1 of the piezoelectric structure 130 is 15 to 35 mm, such as 18 mm, 21 mm, 25 mm, 29 mm, or 32 mm. In some examples, the width W1 of the piezoelectric structure 130 is 1 to 10 mm, such as 2 mm, 3 mm, 5 mm, 7 mm, or 9 mm. The piezoelectric structure 130 extends along the second direction D2 that is perpendicular to the first direction D1. The piezoelectric structure 130 includes a piezoelectric material layer 131, a second electrode layer 132, and the fourth electrode layer 133. In some examples, the piezoelectric material layer 131 includes lead zirconate titanate. The properties of lead zirconate titanate are shown in Table 1 below:

TABLE 1

| | Length (mm) | Width (mm) | Thickness (mm) | C (nF) | tanδ % | Properties | | | Mechanical quality factor $Q_m$ | Dielectric coefficient $\varepsilon$ | Electro-mechanical coupling coefficient $k_r$ |
|---|---|---|---|---|---|---|---|---|---|---|---|
| | | | | | | Z (Ω) | Fr (Hz) | Fa (Hz) | | | |
| 1 | 27.50 | 5.00 | 0.20 | 8.86 | 1.87 | 4.751 | 307700 | 358075 | 46.99 | 1455.37 | 0.64 |
| 2 | | | 0.40 | 4.33 | 2.05 | 10.066 | 311600 | 363600 | 44.18 | 1421.03 | 0.65 |

In Table 1, C is capacitor. tan δ is the dissipation factor of the dielectric. Z is resistance, Fr is resonance frequency, and Fa is anti-resonance frequency; these three factors can be used to derive the mechanical quality factor and the electromechanical coupling coefficient. The derivation formula for the mechanical quality factor and the electromechanical coupling coefficient is as follows:

$$Q_m = \frac{fa^2}{2\pi \times fr \times R \times C(fa^2 - fr^2)}$$

-continued $$k_r = \left(2.51 \times \frac{fa-fr}{fr}\right)^{1/2} \times 100\%$$

According to the content of Table 1, when lead zirconate titanate is used as the material of the piezoelectric material layer 131, the change in thickness does not affect the electromechanical coupling coefficient. Therefore, the thickness of the piezoelectric material layer 131 can be reduced, which accords with the development trend of device thinning. In some examples, the thickness T2 of the piezoelectric material layer is less than 400 µm, such as 350 µm, 300 µm, 250 µm, 200 µm, 150 µm, or 100 µm. When the thickness T2 of the piezoelectric material layer exceeds 400 µm, the development trend of device thinning is not satisfied. However, when the thickness T2 of the piezoelectric material layer 131 is less than 100 µm, it is disadvantageous for mass production of the device.

The second electrode layer 132 is disposed under the piezoelectric material layer 131. The fourth electrode layer 133 has a first portion 133b, a second portion 133c, and a third portion 133a. The first portion 133b of the fourth electrode layer 133 is disposed under the piezoelectric material layer 131. The second electrode layer 132 and the first portion 133b of the fourth electrode layer 133 extend on the same plane, and the second electrode layer 132 and the first portion 133b of the fourth electrode layer 133 have the same thickness T3.

In some examples, the thickness T3 is 1 to 10 µm, such as 2 µm, 3 µm, 4 µm, 5 µm, 6 µm, 7 µm, 8 µm, or 9 µm. The second electrode layer 132 is separated from the first portion 133b of the fourth electrode layer 133 by a gap 134; therefore, the second electrode 132 and the fourth electrode layer 133 are insulated from each other. In some examples, the width W3 of the gap 134 is 0.1 to 1 mm, such as 0.2 mm, 0.3 mm, 0.5 mm, 0.7 mm, or 0.9 mm. In some examples, the length L4 of the second electrode layer 132 is 15 to 35 mm, such as 20 mm, 22 mm, 26 mm, 30 mm, or 32 mm. In some examples, the length L5 of the first portion 133b of the fourth electrode 113 is 0.1 to 2.4 mm, such as 0.2 mm, 0.6 mm, 1.2 mm, 1.8 mm, or 2.2 mm.

The second portion 133c of the fourth electrode layer 133 is disposed on the side wall of the piezoelectric material layer 131. The third portion 133a of the fourth electrode layer 133 is disposed over the piezoelectric material layer 131. The first portion 133b of the fourth electrode layer 133 contacts the second portion 133c of the fourth electrode layer 133, and the second portion 133c of the fourth electrode layer 133 contacts the third portion 133a of the fourth electrode layer 133. In some examples, the second electrode layer 132 and the fourth electrode layer 133 include metal, such as copper or silver.

As shown in FIG. 2, the first electrode layer 112 overlaps with the second electrode layer 132 in the first direction D1, thereby the first electrode layer 112 electrically connects to the second electrode layer 132 by the metal particles 122 which are aligned along the first direction D1. Similarly, the third electrode layer 113 overlaps with the first portion 133b of the fourth electrode layer 133 in the first direction D1, thereby the third electrode layer 113 electrically connects to the fourth electrode layer 133 by the metal particles 122 which are aligned along the first direction D1.

In some examples, the input device 100 further includes a power supply element (not shown), and the power supply element supplies electricity to the piezoelectric material layer 131. When the piezoelectric material layer 131 receives electrical energy, deformation occurs in the piezoelectric material layer 131 because of the material properties of the piezoelectric material layer. Therefore, if an alternating current at a specific frequency is supplied, the piezoelectric material layer 131 will generate vibration and provide functions such as tactile feedback or decontamination.

Figure 4:
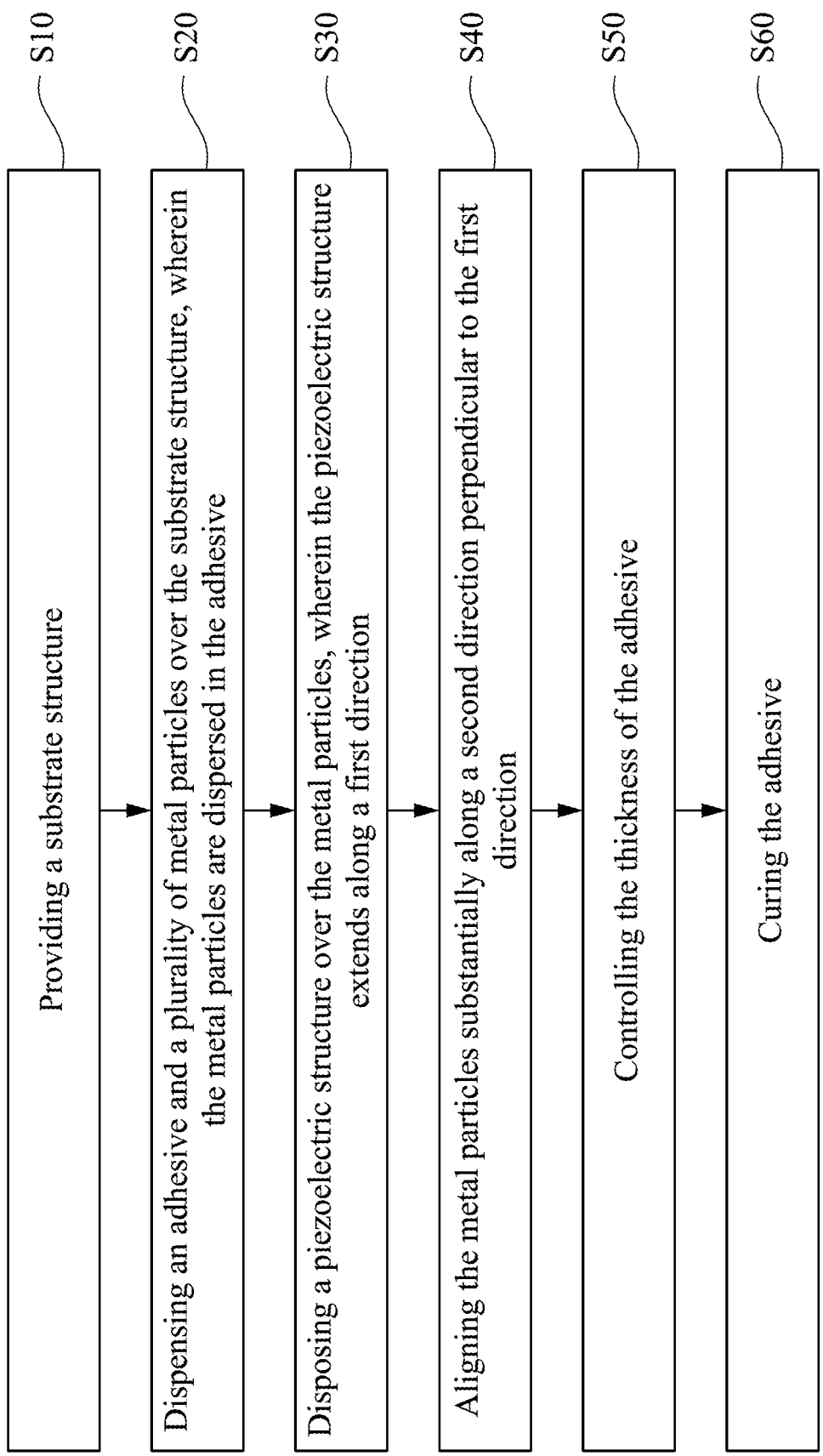
FIG. 4 is a flow chart of a method for manufacturing an input device according to one embodiment of the present disclosure.
Figure 5:
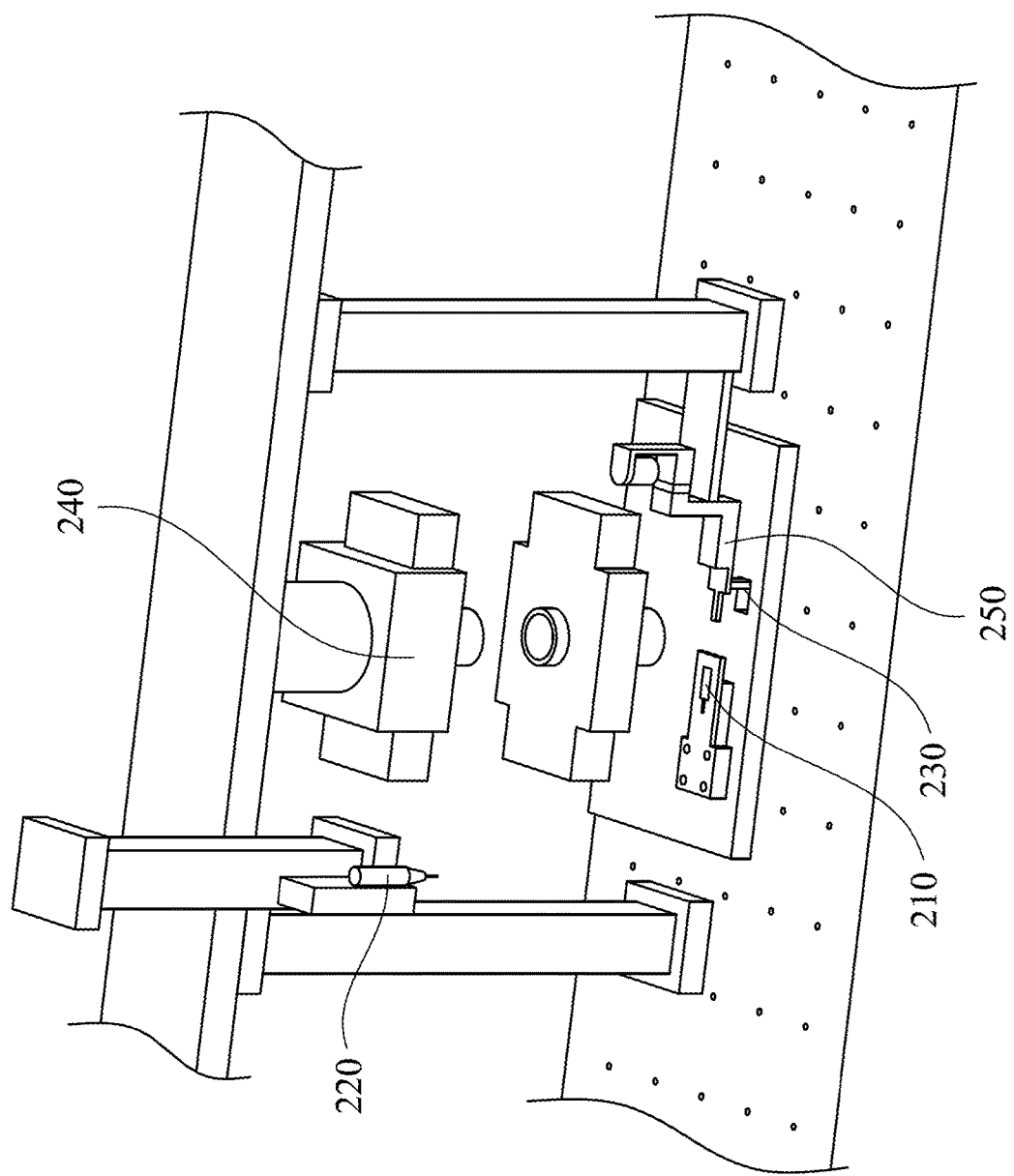
FIG. 5 is a perspective view of an apparatus for manufacturing an input device according to one embodiment of the present disclosure.

The present disclosure also provides a manufacturing method for an input device. Please refer to FIG. 4 and FIG. 5. FIG. 4 illustrates a flow chart of a method for manufacturing an input device according to one embodiment of the present disclosure. FIG. 5 illustrates a perspective view of an apparatus for manufacturing an input device according to one embodiment of the present disclosure.

In step S10, a substrate structure is provided. The substrate structure includes a substrate, a first electrode layer and a third electrode layer both disposed on the substrate. For example, the substrate structure is placed on a dispensing platform 210.

In step S20, an adhesive and a plurality of metal particles are dispensed over the substrate structure. The adhesive covers the first electrode layer and the third electrode layer, and the metal particles are dispersed in the adhesive. For example, the adhesive and the metal particles are dispensed on the substrate structure by a dispensing module 220.

In step S30, a piezoelectric structure is disposed over the adhesive and the metal particles. The piezoelectric structure extends along a first direction and includes a piezoelectric material layer, a second electrode layer disposed under the piezoelectric material layer, and a first portion of a fourth electrode layer disposed under the piezoelectric material layer. For example, the piezoelectric structure is picked up by a vacuum clamping device. An automatic image alignment system 230 is used to align the first electrode layer and the second electrode layer, and to align the third electrode layer and the first portion of the fourth electrode layer. Subsequently, the piezoelectric structure is placed on the adhesive and the metal particles.

In step S40, the metal particles are aligned substantially in a second direction perpendicular to the first direction by providing a magnetic field. For example, the magnetic field is provided by a magnetic field supply module 240. As previously mentioned, the use of a metal having at least one half-full d orbital in the ground state as a material for metal particles provides specific technical effects. Specifically, a metal having at least one half-full d orbital in the ground state can be polarized by external magnetic field, such that the metal particles can be aligned in the direction of the magnetic lines of the magnetic field. As a result, the metal particles along the direction of the magnetic lines can be electrically conductive to each other. In some examples, the intensity of the magnetic field provided is 2500 Gauss.

As mentioned above, the piezoelectric material layer is very fragile, and there is still a risk of rupture of the piezoelectric material layer even if a very low pressure is used for contacting the metal particles with each other. For example, when the thickness of the piezoelectric material layer is 200 µm, even if an extremely low pressure of 1.5 MPa is provided to contact the metal particles with each other, the pressure still cause 10% to 20% of the piezoelectric material layer rupture. Accordingly, the present disclosure provides a method of electrically conducting metal particles to each other without applying pressure, thereby preventing rupture of the piezoelectric material layer caused by pressure.

In step S50, the thickness of the adhesive is controlled by the vacuum clamping device. For example, the thickness of the adhesive is measured by the thickness sensor 250, and the adhesive is adjusted to a desired thickness by a vacuum clamping device according to the required.

In step S60, the adhesive is cured to complete the manufacturing of the input device. For example, the adhesive is heated to 70° C.-120° C., and marinated for 15-90 minutes. When the heating temperature exceeds 120° C., the piezoelectric properties of the piezoelectric material layer will be affected. However, when the heating temperature is below 70° C., the curing efficiency is poor.

As can be realized from the above-described examples of the present disclosure, in the method for manufacturing an input device disclosed herein, metal particles in the conductive adhesive layer can electrically connect to each other without applying pressure. Therefore, in the manufactured input device, rupture of the piezoelectric material layer caused by pressure is prevented.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. Accordingly, the scope of the invention should be determined with reference to the appended claims, along with the full scope of equivalents to which such claims are entitled.

What is claimed is:

1. An input device, comprising:
    a substrate structure comprising a substrate and a first electrode layer disposed over the substrate;
    a conductive adhesive layer disposed on the substrate structure, wherein the conductive adhesive layer includes an adhesive portion and a plurality of metal particles, and the plurality of metal particles are aligned substantially in a first direction; and
    a piezoelectric structure disposed on the conductive adhesive layer, wherein the piezoelectric structure extends along a second direction perpendicular to the first direction, the piezoelectric structure comprises a piezoelectric material layer and a second electrode layer disposed under the piezoelectric material layer, and the conductive adhesive layer is disposed between the first electrode layer and the second electrode layer, and the first electrode layer and the second electrode layer are configured to electrically connect to each other by the plurality of metal particles.

2. The input device of claim 1,
    wherein the substrate structure further comprises a third electrode layer, and the first electrode layer and the third electrode layer are insulated from each other and extend on a same plane; and
    wherein the piezoelectric structure further comprises a fourth electrode layer having a first portion, the second electrode layer and the first portion of the fourth electrode layer are insulated from each other and extend on another same plane, and the third electrode layer and the first portion of the fourth electrode layer are configured to electrically connect to each other by the plurality of metal particles.

3. The input device of claim 1, wherein the plurality of metal particles comprise a metal having at least one half-full d orbital in a ground state.

4. The input device of claim 1, wherein for any two metal particles immediately adjacent along the first direction, a distance between a center of one of the two metal particles and a center of the other of the two metal particles along the second direction is not more than 30 μm.

5. The input device of claim 1, wherein a plurality of columns are formed by the plurality of metal particles, each column of the plurality of columns extends along the first direction, and areas between any two columns of the plurality of columns formed by the plurality of metal particles are free of metal particles.

6. The input device of claim 5, wherein the areas between any two columns of the plurality of columns formed by the plurality of metal particles are filled with the adhesive portion.

7. The input device of claim 6, wherein the adhesive portion comprises an acrylic resin or an epoxy resin.

8. The input device of claim 1, wherein the first electrode layer overlaps with the second electrode in the first direction.

9. The input device of claim 8, wherein the piezoelectric material layer comprises lead zirconate titanate.

10. The input device of claim 8, wherein a thickness of the piezoelectric material layer is less than 400 μm.

11. The input device of claim 8, wherein the substrate structure further comprises a third electrode layer disposed over the substrate, the third electrode layer and the first electrode layer are insulated from each other, the piezoelectric structure further comprises a fourth electrode layer having a first portion, the first portion is disposed under the piezoelectric material layer, the fourth electrode layer and the second electrode layer are insulated from each other, and the third electrode layer overlaps with the first portion of the fourth electrode layer in the first direction.

12. The input device of claim 11, wherein the first electrode layer and the third electrode layer extends on a same plane, the second electrode layer and the first portion of the fourth electrode extends on another same plane.

13. The input device of claim 11, wherein the fourth electrode layer further comprises a second portion disposed on a side wall of the piezoelectric material layer, and a third portion disposed on the piezoelectric material layer, the first portion contacts the second portion, and the second portion contacts the third portion.

14. The input device of claim 11, wherein:
    a plurality of columns each extending along the first direction are formed by the plurality of metal particles, and areas between any two columns of the plurality of columns formed by the plurality of metal particles are free of metal particles; and
    the first electrode layer and the second electrode layer are spatially separated in the first direction, and interconnected by a first grouping of columns of the plurality of columns formed by the plurality of metal particles.

15. The input device of claim 14, wherein the third electrode layer and the fourth electrode layers are spatially separated in the first direction, and interconnected by a second grouping of columns of the plurality of columns formed by the plurality of metal particles, the first grouping of columns being different from the second grouping of columns.

16. A method for manufacturing an input device, comprising:
    (i) providing a substrate structure, wherein the substrate structure comprises a substrate and a first electrode layer disposed over the substrate;
    (ii) dispensing an adhesive and a plurality of metal particles over the substrate structure, wherein the plurality of metal particles are dispersed in the adhesive;
    (iii) disposing a piezoelectric structure over the plurality of metal particles, wherein the piezoelectric structure extends along a first direction, the piezoelectric structure comprises a piezoelectric material layer and a second electrode layer disposed under the piezoelectric material layer, and the conductive adhesive layer is disposed between the first electrode layer and the second electrode layer;

(iv) aligning the plurality of metal particles along substantially a second direction perpendicular to the first direction, wherein the first electrode layer and the second electrode layer are configured to electrically connect to each other by the plurality of metal particles; and (v) curing the adhesive.

17. The method for manufacturing the input device of claim 16, wherein step (iv) is performed by providing a magnetic field.

18. The method for manufacturing the input device of claim 16,
wherein the substrate structure further comprises a third electrode layer, and the first electrode layer and the third electrode layer are insulated from each other and extend on a same plane;
wherein the piezoelectric structure further comprises a fourth electrode layer having a first portion, the second electrode layer and the first portion of the fourth electrode layer are insulated from each other and extend on another same plane; and
wherein in step (iv) the third electrode layer and the first portion of the fourth electrode layer are configured to electrically connect to each other by the plurality of metal particles.

* * * * *